(12) United States Patent
Hirler et al.

(10) Patent No.: US 7,511,336 B2
(45) Date of Patent: Mar. 31, 2009

(54) VERTICAL TRENCH TRANSISTOR

(75) Inventors: Franz Hirler, Isen (DE); Wolfgang Werner, Munich (DE); Joachim Krumery, Göbersdorf (AT)

(73) Assignee: Infineon Technologies AG, Munich (DE)

( * ) Notice: Subject to any disclaimer, the term of this patent is extended or adjusted under 35 U.S.C. 154(b) by 349 days.

(21) Appl. No.: 11/287,154

(22) Filed: Nov. 25, 2005

(65) Prior Publication Data

US 2006/0138533 A1    Jun. 29, 2006

(30) Foreign Application Priority Data

Nov. 26, 2004    (DE)    ........................ 10 2004 057 235

(51) Int. Cl.
  *H01L 29/94*    (2006.01)
(52) U.S. Cl. .................. 257/330; 257/334; 257/347; 257/471; 257/E29.121; 257/E29.26
(58) Field of Classification Search .............. 257/330, 257/E29.066, E29.121, E29.133, 73, 471, 257/476, 499, 334, 347, E29.26, E20.966
  See application file for complete search history.

(56) References Cited

U.S. PATENT DOCUMENTS 5,891,776 A *  4/1999  Han et al. .................. 438/274

| | | |
|---|---|---|
| 6,351,018 B1 | 2/2002 | Sapp |
| 6,998,678 B2 | 2/2006 | Werner et al. |
| 2003/0020134 A1 * | 1/2003 | Werner et al. ............... 257/471 |
| 2003/0040144 A1 | 2/2003 | Blanchard et al. |
| 2003/0155628 A1 | 8/2003 | Zeng et al. |
| 2004/0164304 A1 | 8/2004 | Magri et al. |

FOREIGN PATENT DOCUMENTS

DE    102 14 160 A1    10/2003

* cited by examiner

*Primary Examiner*—Sue A Purvis
*Assistant Examiner*—Fazli Erdem
(74) *Attorney, Agent, or Firm*—Maginot, Moore & Beck

(57) ABSTRACT

A vertical trench transistor has a first electrode, a second electrode and also a semiconductor body arranged between the first and second electrodes, there being formed in the semiconductor body a plurality of transistor cells comprising source region, body region, drift region and gate electrode and also contact holes for making contact with the source and body regions, contact being made with the source and body regions by means of the first electrode, and at least the bottom of each contact hole adjoining at least one drift region, so that Schottky contacts between the first electrode and corresponding drift regions are formed at the bottoms of the contact holes. The dimensions and configurations of the body regions or of the body contact regions optionally arranged between body regions and contact holes are chosen in such a way as to avoid excessive increases in electric fields at the edges of the contact hole bottoms.

11 Claims, 6 Drawing Sheets

US 7,511,336 B2

VERTICAL TRENCH TRANSISTOR

FIELD OF THE INVENTION

The invention relates to a trench transistor having a plurality of transistor cells and also a plurality of Schottky diodes connected in parallel with the transistor cells.

BACKGROUND

FIG. 1 shows a trench transistor of the type referred to above. A trench transistor 1 has a first electrode 2, a second electrode 3 and also a semiconductor body 4 arranged between the first and second electrodes 2, 3. A plurality of transistor cells 5 are formed in the semiconductor body 4. Each transistor cell has a source region 6, a body region 7, a drift region 8 and also a gate electrode 9. The gate electrode 9 is provided within a trench 10 extending from the top side of the semiconductor body 4 in the vertical direction into the semiconductor body, the gate electrode 9 being insulated from the semiconductor body 4 by an insulation layer 11. Contact holes 12 serving for making contact with the source and body regions 6, 7 are furthermore provided. The contact holes 12 are completely filled by the first electrode 2, which is composed of a metallic material. The bottom 13 of each contact hole 12 adjoins the drift region 8, whereby the bottoms 13 form Schottky contacts between the first electrode 2 and the drift region 8. Furthermore, a portion 14 of the side walls of the contact holes 12 likewise constitutes a Schottky contact. A highly doped connection zone 15 adjoining the second electrode 3 is formed in the semiconductor body 4. The source regions 6 and also the gate electrodes 9 are electrically insulated from the first electrode 2 toward the top by means of an insulation layer or passivation layer 16.

The trench transistor 1 shown in FIG. 1 is used in particular for switching inductive loads, for example motors. As long as the trench transistor 1 is operated in the forward direction, that is to say as long as a positive drain/source voltage is present, the Schottky contacts in between the first electrode 2 and the drift region 8 effect blocking. However, if a negative drain/source voltage is present, then the Schottky contacts conduct and thus function as freewheeling elements. A negative drain/source voltage may be brought about for example during the switching of inductive loads by the trench transistor 1 on account of a voltage which is induced by the inductive load after the trench transistor 1 has been turned off.

As can be gathered from FIG. 1, the Schottky contacts are connected in parallel with body diodes formed by the pn junctions between the body regions 7 and the drift region 8 and also the short circuit between the body regions 7 and the source zones 6. The forward voltages of the Schottky diodes are lower than the forward voltages of the body diodes, so that the Schottky diodes always turn on before the body diodes.

The advantage of the Schottky diodes is that in contrast to the body diodes, when the trench transistor 1 is operated in the forward direction, the transistor cells 5 do not store any charge carriers which have to be depleted from the transistor cells 5 again when the trench transistor 1 undergoes transition to the off state. Consequently, the Schottky diodes contribute to reducing switching losses during the switching of inductive loads.

What is disadvantageous about the trench transistor 1 described in FIG. 1 is that excessive increases in the electric field strength can readily occur at corners 17 (corners of the contact holes 12). However, high electric field strengths entail high leakage currents, which is undesirable. The leakage currents are additionally intensified as reverse voltages lying in the region of the breakdown voltage of the trench transistor 1.

SUMMARY

The object on which the invention is based is to specify a vertical trench transistor which enables the problems described above to be avoided.

This object is achieved by a trench transistor according to embodiments of the invention. The object is also achieved by methods for fabricating body regions or body contact regions of a trench transistor according to embodiments of the invention.

The trench transistor according to a first embodiment of the invention has a first electrode, a second electrode and also a semiconductor body arranged between the first and second electrodes, there being formed in the semiconductor body:

a plurality of transistor cells comprising source region, body region, drift region and gate electrode and also
contact holes for making contact with the source and body regions. Contact is made with the source and body regions using the first electrode. At least the bottom of each contact hole adjoins at least one drift region, so that Schottky contacts between the first electrode and corresponding drift regions are formed at the bottoms of the contact holes. The dimensions and configurations of the body regions or of the body contact regions optionally arranged between body regions and contact holes are chosen in such a way as to avoid excessive increases in electric fields at the edges of the contact hole bottoms (in particular at the corners of the contact hole bottoms).

According to at least some embodiments of the invention, the body regions or the body contact regions are used for potential line management, in the vicinity of the Schottky contacts. This may be achieved for example by the edges/corners of the contact holes being embedded in the body region/body contact regions. As an alternative to this, it is possible for the body regions/body contact regions not to be permitted to directly adjoin the edges or corners of the contact holes, but rather for these merely to be partially "led around" the corners/edges.

In one preferred embodiment, the vertical positions of the contact hole bottoms are situated at a higher level than the vertical positions of those ends of the body regions/body contact regions which face the drift regions.

In an advantageous manner, the body regions/body contact regions are configured in such a way that at least a portion of the undersides of the contact hole bottoms is covered by the body regions/body contact regions.

In a particularly preferred embodiment, the vertical distance between the contact hole bottoms and the lower ends of the body regions/body contact regions is more than half the horizontal extent of the Schottky contact adjoining the body regions/body contact regions.

The trench transistor can be configured in diverse ways. By way of example, it is possible to arrange field electrodes (preferably below the gate electrodes) within the trenches in which the gate electrodes are provided.

Another embodiment of the invention furthermore provides a method for fabricating the body regions or the body contact regions in a vertical trench transistor. The method has the following steps of:

forming the contact holes in the semiconductor body,
covering the contact hole bottoms with a masking layer, and producing a body region by applying corresponding dopants to the uncovered inner walls of the contact holes.

The application of dopants to the inner walls of the contact holes may be effected by indiffusion or implantation, by way of example. The indiffusion may be effected for example directly from the vapor phase, or by heating doped material which has been applied to the uncovered inner walls.

In order to ensure that the dopants diffuse into regions which lie below the Schottky contacts, and thus enclose the edges/corners of the Schottky contacts, it may be advantageous to perform heat treatment processes (outdiffusion processes).

Optionally, after the formation of the body regions, a body contact region may be produced for example by corresponding dopants being applied to the uncovered inner walls (that is to say the portion of the inner walls which is not covered by the mask layer).

If the dopants are introduced into the semiconductor body by means of an implantation method, then the masking layer may also be omitted given a sufficiently precise implantation beam.

The above-described process for fabricating the body regions/body contact regions was based on the use of masking layers. As an alternative to this, it is possible to fabricate the body regions or body contact regions by means of the following steps of:

forming the contact holes in the semiconductor body,
fabricating a body region by corresponding dopants being applied to the uncovered inner walls of the contact holes (that is to say dopants are applied to all the inner walls of the contact holes), and
redoping the regions of the body regions which lie below the bottoms of the contact holes.

Optionally, after the formation of the body regions, body contact regions may be produced. For this purpose, it is possible, by way of example, for the bottoms of the contact holes (or parts thereof) to be covered with corresponding mask layers, and then for dopants to be indiffused into the uncovered inner walls. As an alternative, the body contact regions may be introduced into the side walls of the contact holes by oblique implantation of corresponding dopants.

It is furthermore possible to fabricate the body regions by means of the following steps of:

forming body regions in the semiconductor body,
forming contact holes in the semiconductor body in such a way that the body regions are penetrated by the contact holes,
applying corresponding dopants to uncovered inner walls of the contact holes in such a way that the body regions are extended to regions which adjoin the edges of the contact hole bottoms or surround the latter. The body region may be outdiffused before the formation of the contact holes.

In principle, it is also possible to fabricate both body regions and body contact regions by means of oblique implantation. In this case, masks would no longer be necessary for the formation of these regions given a sufficiently precise implantation beam.

BRIEF DESCRIPTION OF THE DRAWINGS

The invention is explained in more detail below in exemplary embodiment with reference to the figures, in which.

DETAILED DESCRIPTION

Figure 1:
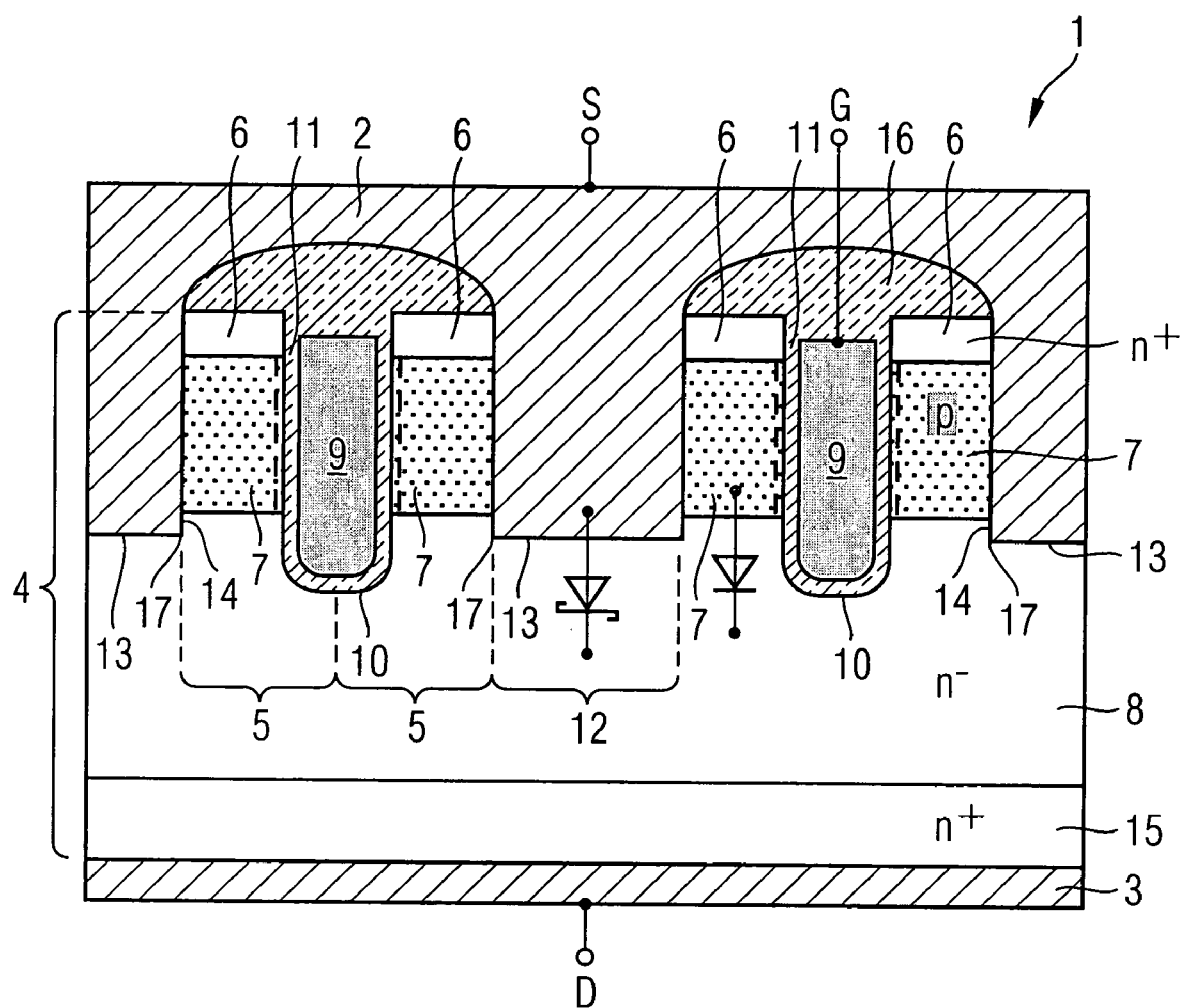
FIG. 1 shows a known trench transistor in a cross-sectional illustration.

In the figures, identical or mutually corresponding regions, components or component groups are identified by the same reference numerals. Furthermore, all the embodiments may be doped inversely, that is to say that n-type regions and p-type regions may be interchanged with one another.

Figure 2:
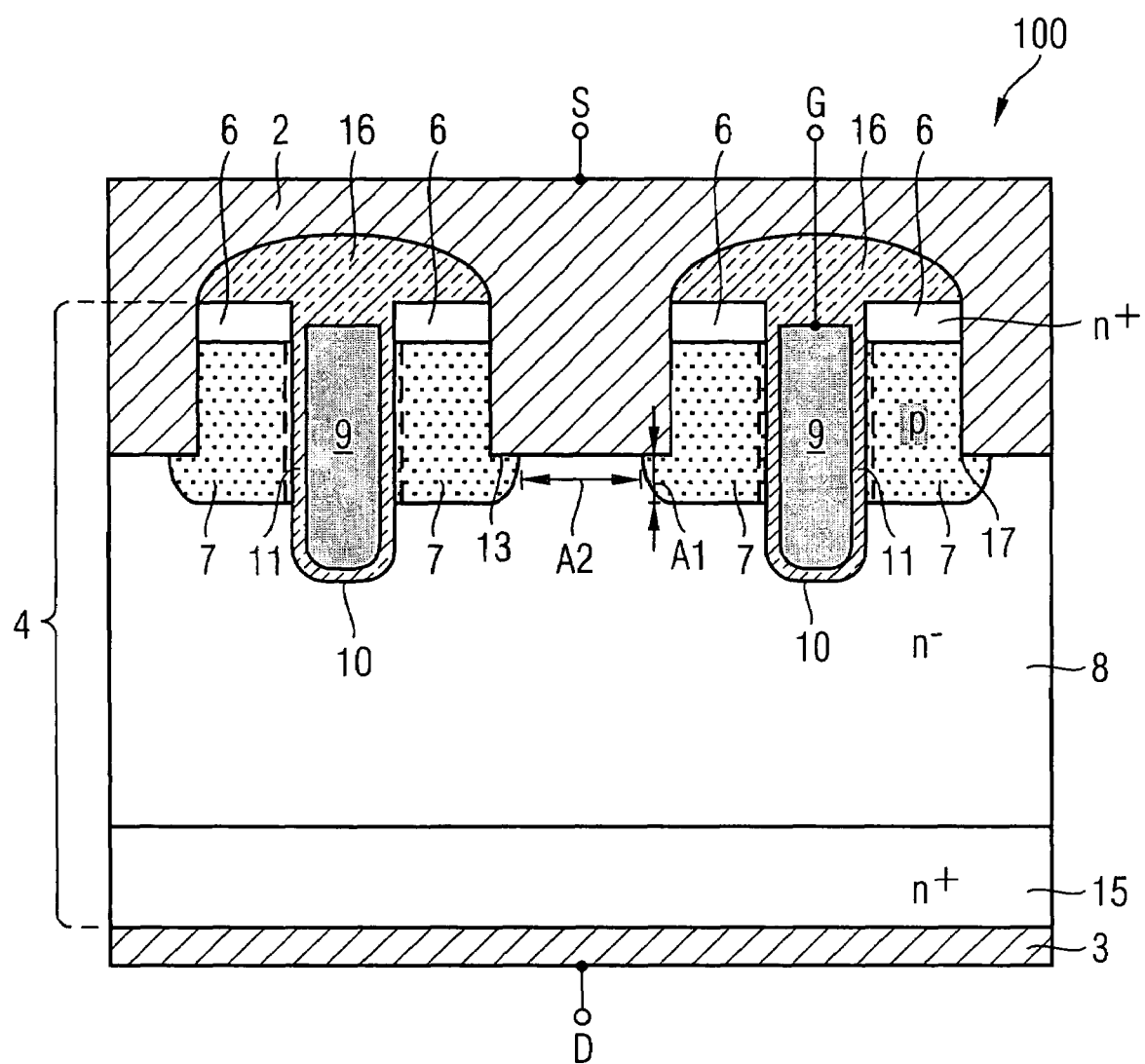
FIG. 2 shows a first embodiment of the trench transistor according to the invention in a cross-sectional illustration.

FIG. 2 shows a first embodiment of the trench transistor according to the invention.

FIG. 1 shows a trench transistor of the type referred to above. A trench transistor 1 has a first electrode 2, a second electrode 3 and also a semiconductor body 4 arranged between the first and second electrodes 2, 3. A plurality of transistor cells 5 are formed in the semiconductor body 4. Each transistor cell has a source region 6, a body region 7, a drift region 8 and also a gate electrode 9. Furthermore, a highly doped connection zone 15 adjoining the second electrode 3 is formed in the semiconductor body 4. The gate electrode 9 is provided within a trench 10 extending from the top side of the semiconductor body 4 in the vertical direction into the semiconductor body, the gate electrode 9 being insulated from the semiconductor 4 by an insulation layer 11. Contact holes 12 serving for making contact with the source and body regions 6, 7 are furthermore provided. The contact holes 12 are completely filled by the first electrode 2, which is composed of a metallic material. The bottom 13 of each contact hole 12 adjoins the drift region 8, whereby the bottoms 13 form Schottky contacts between the first electrode 2 and the drift region 8. Furthermore, a portion 14 of the side walls of the contact holes 12 likewise constitutes a Schottky contact. The source regions 6 and also the gate electrodes 9 are electrically insulated from the first electrode 2 toward the top by means of an insulation layer or passivation layer 16.

An important difference between the trench transistors shown in FIGS. 1 and 2 is that, in the case of the trench transistor 100, the corners 17 of the contact holes 12 are embedded in the body regions 7, that is to say the body regions 7 extend around or are "drawn around" the corners 17. In this way, it is possible to prevent an excessive increase in the field strengths of the electric field at the corners 17.

In this case, the vertical distance A1 between the bottoms 13 of the contact holes and the lower ends of the body regions 7 is preferably greater than half the horizontal extent A2 of the Schottky contacts at the bottoms 13 of the contact holes.

Figure 3:
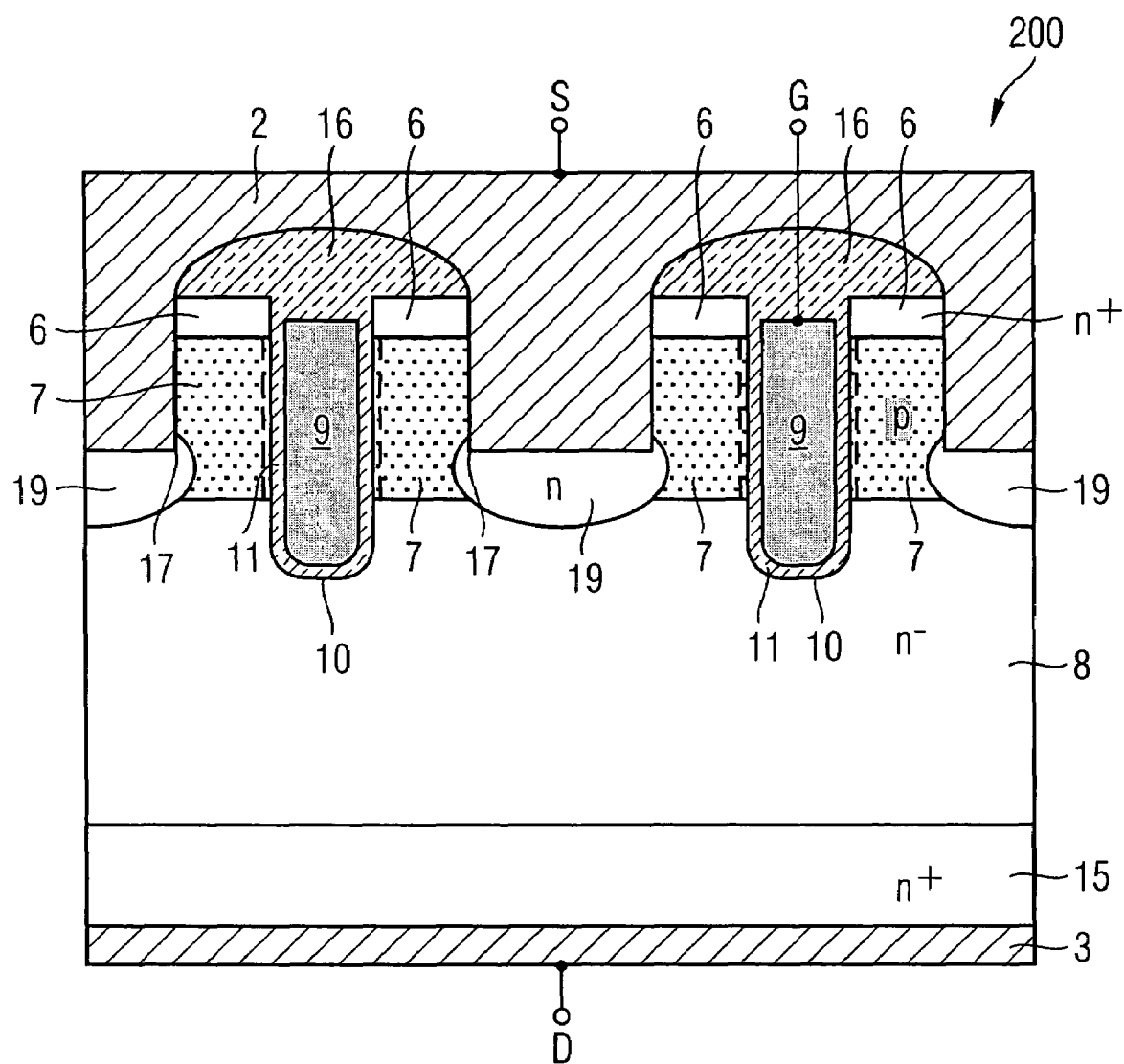
FIG. 3 shows a second embodiment of the trench transistor according to the invention in a cross-sectional illustration.

The trench transistor 200 shown in FIG. 3 differs from the trench transistor 100 shown in FIG. 2 by virtue of the fact that although the body regions 7 extend past or are "drawn around" the corners 17, they do not directly adjoin the corners 17. Provision is furthermore made of n-doped regions 19 below the bottoms 13 of the contact holes.

Figure 4:
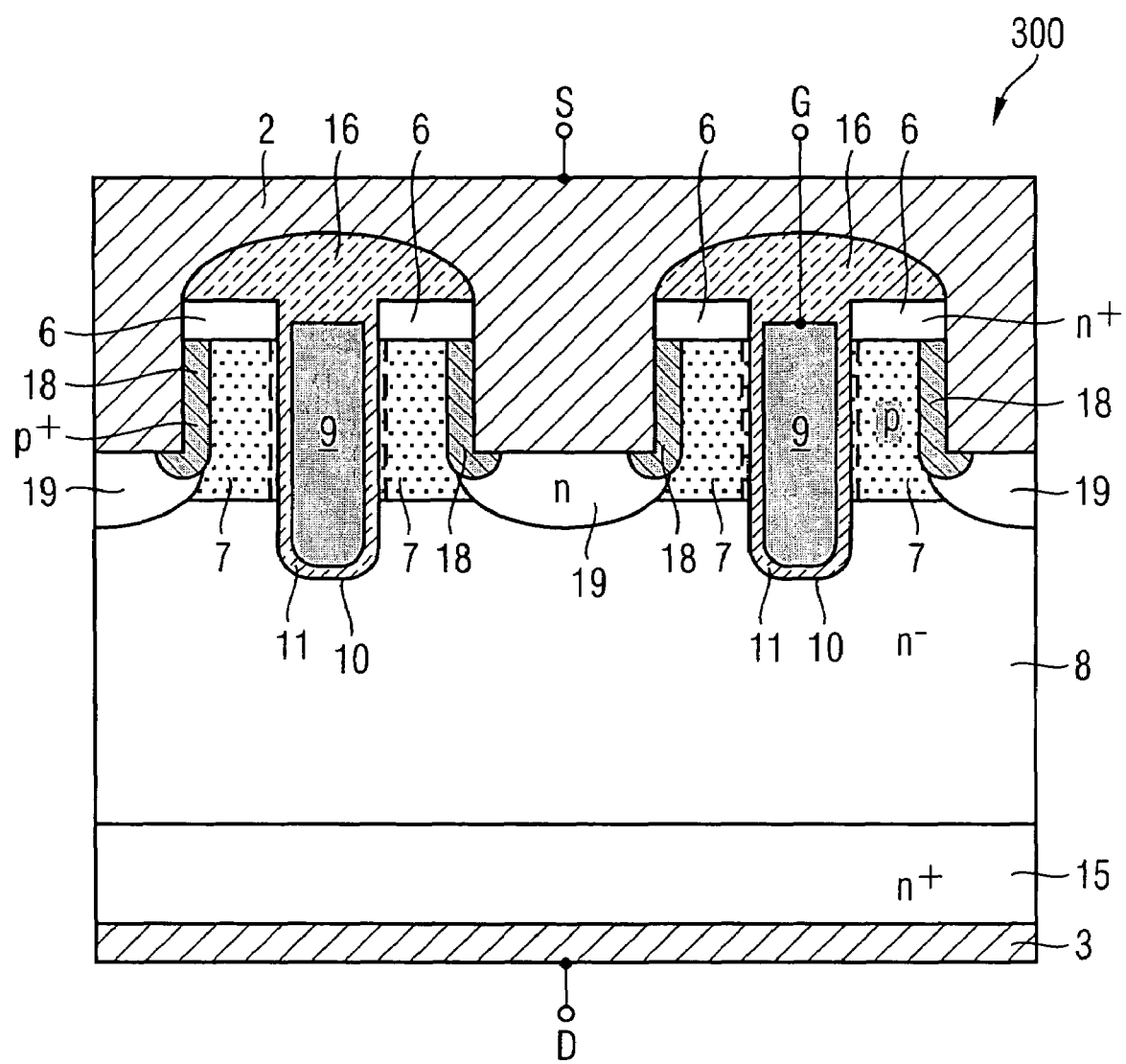
FIG. 4 shows a third embodiment of the trench transistor according to the invention in a cross-sectional illustration.

The trench transistor 300 shown in FIG. 4 differs from the trench transistor 200 shown in FIG. 3 by virtue of the fact that provision is additionally made of body contact regions 18 which extend past and around the corners 17 and directly adjoin the latter. The shielding effect is thus performed by the body contact regions 18 in this embodiment.

Figure 5:
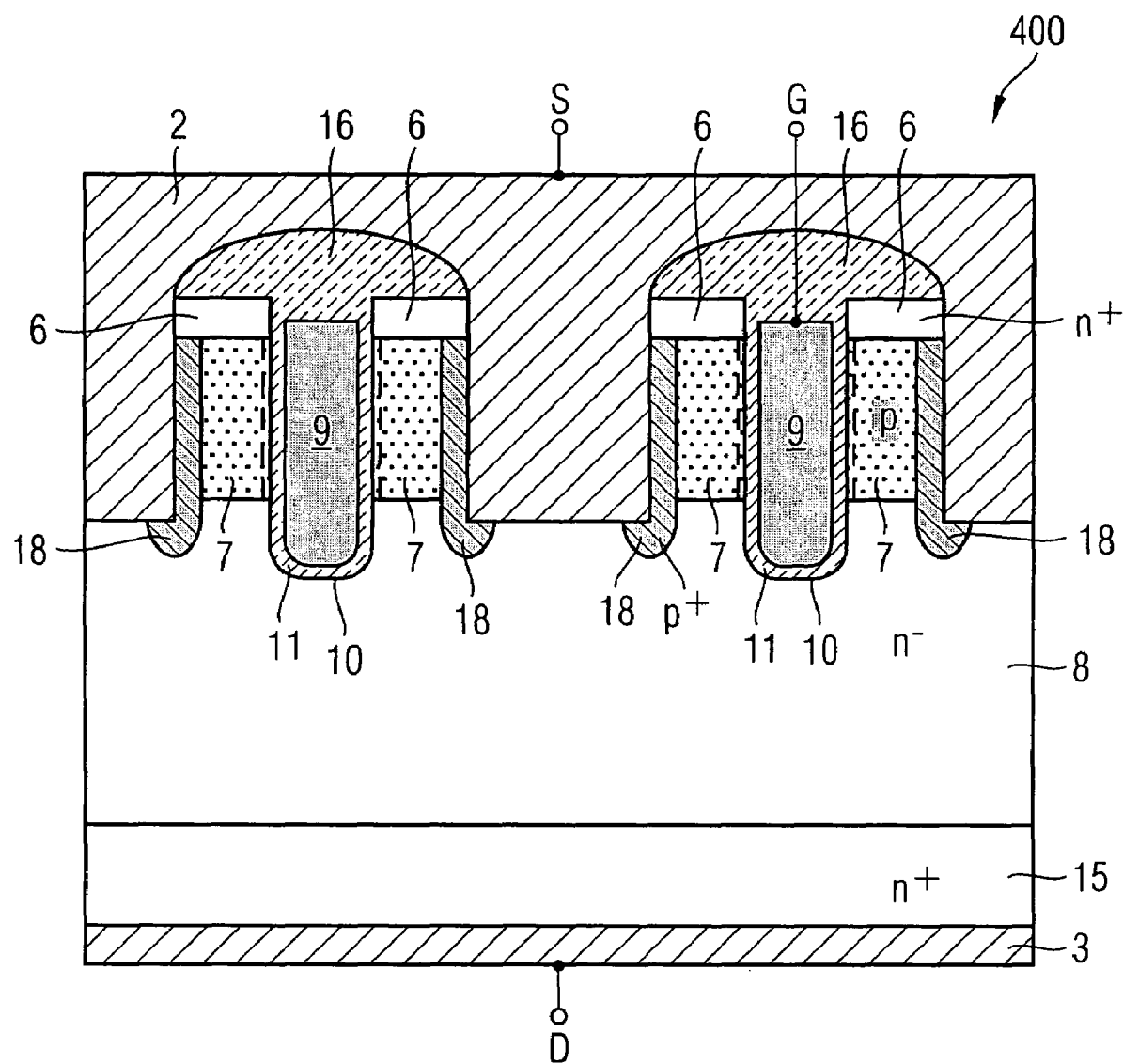
FIG. 5 shows a fourth embodiment of the trench transistor according to the invention in a cross-sectional illustration.

The trench transistor 400 shown in FIG. 5 differs from the trench transistor 300 shown in FIG. 4 by virtue of the fact that the vertical positions of the lower ends of the body contact regions 18 are situated at a deeper level than the vertical positions of the body regions 7. Furthermore, there are no n-doped regions 19 present below the bottoms of the contact holes.

Figure 6:
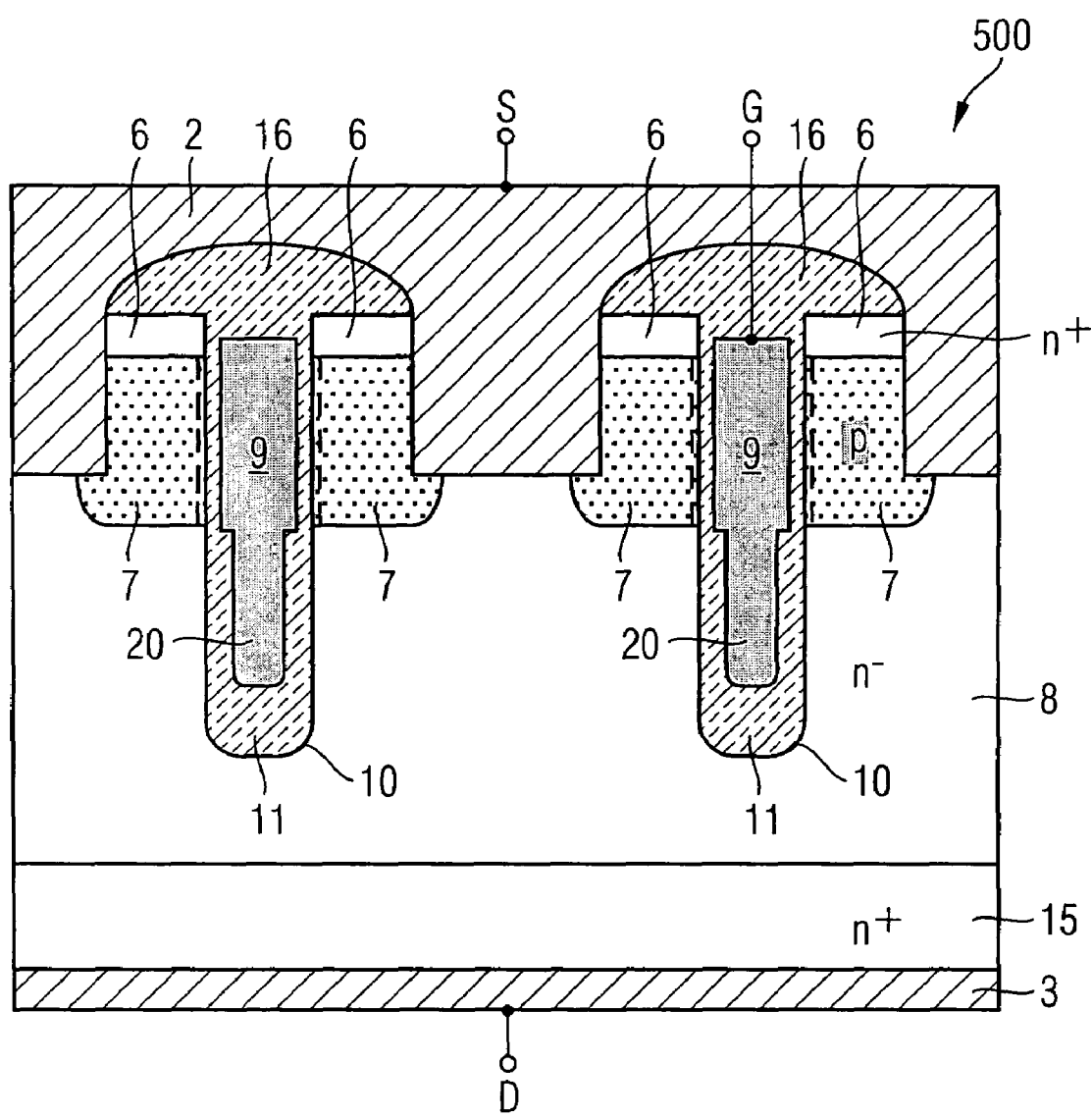
FIG. 6 shows a fifth embodiment of the trench transistor according to the invention in a cross-sectional illustration.

The trench transistor 500 shown in FIG. 6 differs from the trench transistor 100 shown in FIG. 2 by virtue of the fact that the gate electrodes 9 are connected to field electrodes 20, and that correspondingly for this purpose the insulation layers 11 are configured in a thickened fashion in the lower trench region. Furthermore, in this embodiment, the trenches 10 reach deeper into the drift region 8.

The body regions/body contact regions 7, 18 may be fabricated by indiffusion or oblique implantation. The n-doped region 19 may be produced by redoping a p-type region; that is to say that, in an advantageous manner, firstly a contiguous body region is produced in the trench transistors 200 and 300, said body region covering the entire trench bottoms 13, and then the region situated below the trench bottoms is redoped into the n-doped region 19.

Further aspects of the invention will be explained in the description below.

According to at least some embodiments of the invention, a Schottky diode is integrated into the trench contact of a trench transistor cell, shielding p-type regions preferably directly adjoining the Schottky contact. In this case, essentially the entire trench contact bottom area can be used as the Schottky contact, as a result of which smaller diode losses can be obtained on account of a smaller current density. A further advantage is that the electric fields at the Schottky contact are drastically reduced by virtue of the small spacing of the shielding in the region of 100 nm in contrast to a few μm in the prior art. As a result, the multiplication of the Schottky diode leakage current does not take effect; furthermore, the electric field is limited at the Schottky contact and degradation of the device due to avalanche is prevented.

A further advantage is that no additional area is required for the Schottky diode and the masking of the body and source regions can be dispensed with. Moreover, it is possible to cover corners of the Schottky contact (line of intersection of trench bottom and trench side wall) and thus to avoid high reverse currents due to high fields at the corners.

The depth of the shielding pn junction below the Schottky contact may be chosen to be greater than half the remaining bottom opening.

In one preferred embodiment, the body region is outdiffused after the etching of the contact trench or a second diffusion step is carried out, so that it diffuses under the Schottky contact and around the corners of the trench. This may be effected without additional masking if the body region is implanted in the entire cell and optionally partly outdiffused and the trench is then etched to below the body region. The trench cell described above can be integrated into an IC process. In this case, it is possible to contact-connect the drain potential to the surface and to use p-type substrates.

The invention claimed is:

1. A vertical trench transistor having a first electrode, a second electrode and a semiconductor body arranged between the first and second electrodes, and there being formed in the semiconductor body:
   a plurality of transistor cells comprising source regions, body portion regions, at least one drift region and gate electrodes, each body portion region including a body region;
   contact holes configured to contact the source and body regions, contact being made with the source regions and body regions using the first electrode, and the bottom of at least one contact hole adjoining at least one drift region, such that Schottky contacts between the first electrode and corresponding drift regions are formed at the bottoms of the at least one contact hole,
   wherein the body portion regions are configured in such a way as to avoid excessive increases in electric fields at edges of the bottoms of the at least one contact hole, and
   wherein a portion of the undersides of the contact hole bottoms are covered by the body portion regions.

2. The trench transistor as claimed in claim 1, wherein each body portion region further includes a body contact region disposed between the body region and the first electrode.

3. The trench transistor as claimed in claim 1, wherein vertical positions of the contact hole bottoms are situated at a higher level than vertical positions of ends of the body portion regions that face the drift region.

4. The trench transistor as claimed in claim 3, wherein outer sides of corners defined at edges of the contact hole bottoms are covered by the body portion regions.

5. The trench transistor as claimed in claim 1, wherein field electrodes are formed within the trenches in which the gate electrodes are provided.

6. A vertical trench transistor having a first electrode, a second electrode and a semiconductor body arranged between the first and second electrodes, and there being formed in the semiconductor body:
   a plurality of transistor cells comprising source regions, body portion regions, at least one drift region and gate electrodes, each body portion region including a body region;
   contact holes configured to contact the source and body regions, contact being made with the source regions and body regions using the first electrode, and the bottom of at least one contact hole adjoining at least one drift region, such that Schottky contacts between the first electrode and corresponding drift regions are formed at the bottoms of the at least one contact hole,
   wherein the body portion regions are configured in such a way as to avoid excessive increases in electric fields at edges of the bottoms of the at least one contact hole, and
   wherein a vertical distance between at least one contact hole bottom and a lower end of at least one body portion region is greater than half of a horizontal extent of the Schottky contact.

7. The trench transistor as claimed in claim 6, wherein each body portion region further includes a body contact region disposed between the body region and the first electrode.

8. The trench transistor as claimed in claim 6, wherein field electrodes are formed within the trenches in which the gate electrodes are provided.

9. A vertical trench transistor having a first electrode, a second electrode and a semiconductor body arranged between the first and second electrodes, and there being formed in the semiconductor body:
   a plurality of transistor cells comprising source regions, body portion regions, at least one drift region and gate electrodes, each body portion region including a body region;
   contact holes configured to contact the source and body regions, contact being made with the source regions and body regions using the first electrode, and the bottom of at least one contact hole adjoining at least one drift region, such that Schottky contacts between the first electrode and corresponding drift regions are formed at the bottoms of the at least one contact hole, wherein the body portion regions are configured in such a way as to avoid excessive increases in electric fields at edges of the bottoms of the at least one contact hole, wherein vertical positions of the contact hole bottoms are situated at a higher level than vertical positions of ends of the body portion regions that face the drift region, and wherein a vertical distance between at least one contact hole bottom and a lower end of at least one body portion region is greater than half of a horizontal extent of the Schottky contact.

10. The trench transistor as claimed in claim 9, wherein outer sides of corners defined at edges of the contact hole bottoms are covered by the body portion regions.

11. The trench transistor as claimed in claim 9, wherein field electrodes are formed within the trenches in which the gate electrodes are provided.

* * * * *